United States Patent [19]

Nagesh et al.

[11] Patent Number: 5,198,412
[45] Date of Patent: * Mar. 30, 1993

[54] METHOD FOR MAKING SUPERCONDUCTOR FILMS

[75] Inventors: V. K. Nagesh, Cupertino; John T. Anderson, Woodside, both of Calif.

[73] Assignee: Hewlett-Packard Company, Palo Alto, Calif.

[*] Notice: The portion of the term of this patent subsequent to Aug. 20, 2008 has been disclaimed.

[21] Appl. No.: 808,944

[22] Filed: Dec. 13, 1991

Related U.S. Application Data

[63] Continuation of Ser. No. 582,266, Sep. 14, 1990, abandoned, which is a continuation of Ser. No. 67,510, Jun. 26, 1987, Pat. No. 5,041,420.

[51] Int. Cl.$^5$ .................. B05D 3/02; B05D 5/12
[52] U.S. Cl. ........................ 505/1; 505/728; 505/734; 505/736; 505/742; 430/311; 430/318; 430/323; 430/327; 430/330; 427/62; 427/63; 427/226; 427/377
[58] Field of Search ............... 430/311, 313, 318, 320, 430/323, 327, 330; 427/62, 63, 96, 123, 126.3, 229, 252, 226, 255.3, 271, 343, 377, 376.2; 505/1, 728, 734, 736, 742

[56] References Cited

U.S. PATENT DOCUMENTS

| | | | |
|---|---|---|---|
| 3,366,519 | 1/1968 | Pritchard et al. | 427/63 |
| 4,826,808 | 5/1989 | Yurek et al. | 427/62 |
| 4,997,809 | 3/1991 | Gupta | 505/1 |
| 5,021,398 | 6/1991 | Sharma et al. | 505/1 |

OTHER PUBLICATIONS

Evetts, J. E. et al. "Structural Stability & Kinetic Processes in YBaCuO Thin Films and Device Structures" *Proceedings of Symposium S;* 1987 Spring Meeting of the Materials Research Society Apr. 1987, pp. 227-229.

Owen et al. "Application of IC Technology to Fabrication of Lg. Numbers of Niobium based Josephson Junctions" *IEEE transactions on Magnetics*; vol. MAG-11 No. 2 pp. 774-777 Mar. 1975.

Kirschman et al. "Advances in Superconducting Quantum Electronic Microcircuit Fabrication" *IEEE Transactions on Magnetics*; vol. MAG-11 No. 2 pp. 778-781 Mar. 1975.

*Primary Examiner*—Marion E. McCamish
*Assistant Examiner*—Kathleen Duda

[57] ABSTRACT

A process is disclosed for producing superconductor films on a variety of substrates, and more particularly a patterned superconductor film on a planar substrate. The basic process includes the steps of: 1) depositing a metal film of superconductor precursor elements on a substrate; 2) patterning the metal film; and 3) oxidizing the metal film to form a superconductor film. Because the process separates the metal precursor film formation, patterning, and oxidation steps, each of the steps can be individually optimized.

7 Claims, No Drawings

METHOD FOR MAKING SUPERCONDUCTOR FILMS

This is a continuation of copending application Ser. No. 07/582,266 filed on Sep. 14, 1990 now abandoned which is a continuation of application Ser. No. 07/067,510, filed Jun. 26, 1987 now U.S. Pat. No. 5,041,420.

BACKGROUND OF THE INVENTION

1. Technical Field

This invention relates generally to methods for producing films, and more particularly to methods for producing thin films in superconducting circuits.

2. Background Art

The phenomenon of superconductivity was discovered by K. H. Onnes in 1911 when he demonstrated that the electrical resistance of mercury drops to zero when it is cooled to approximately 4 Kelvins (K) above absolute zero temperature. For many years the phenomenon remained a scientific curiosity, with few practical uses.

Theoretically, superconductivity has many potential uses. For example, superconducting power lines could save a great deal of energy would otherwise be dissipated during transmission. Small and extremely powerful superconducting magnets, generators, and motors could be built. Superconducting devices known as Josephson junctions are extremely fast electronic switches having very low power consumption. In fact, the potential uses for superconducting materials are so many and varied, that an attempt make a comprehensive list of possible applications is almost an exercise in futility.

Despite the potential benefits of superconducting devices and structures, in the past they were seldom found outside of research laboratories because it was too expensive to cool most materials to their superconducting transition temperature $T_c$. This was due to the fact that, prior to early 1987, all known superconductor materials had a transition temperature within a few dozen degrees Kelvin of absolute zero, requiring the use of expensive liquid helium cooling systems.

On Mar. 2, 1987, M. K. Wu et al. published a paper entitled "Superconductivity at 93 K in a New Mixed-Phase Y-Ba-Cu-O Compound System at Ambient Pressure" in Physical Review Letters, Volume 58, Number 9. This announcement caused considerable excitement in the scientific and business communities because, for the first time, a superconductor material had been discovered which could use liquid nitrogen as a coolant. Since liquid nitrogen cooling systems are at least an order of magnitude less expensive than liquid helium cooling systems, many applications for superconductors suddenly became practical after Wu et al.'s discovery.

One of the more promising uses for this new material is the aforementioned Josephson junction devices. Because Josephson junction devices can switch on-and-off extremely quickly, they can improve the performance of digital circuitry by several orders of magnitude. For example, Josephson junction devices can be used in picosecond sampler circuits and in ultra-fast supercomputers.

A problem with making Josephson junction devices with the new YBaCuO material is that it is difficult to deposit and pattern. More often than not, attempts at etching thin films of YBaCuO by using conventional photolithographic techniques have resulted in the destruction of its superconducting properties.

DISCLOSURE OF THE INVENTION

An object of this invention is to provide an economical and efficient method for producing thin film superconductors.

Another object of this invention is to provide an economical and efficient method for producing patterned thin film superconductors.

Briefly, a method in accordance with the present invention for producing a patterned thin film superconductor involves the steps of 1) forming a metal precursor film on a surface of a substrate; 2) patterning the metal precursor film; and 3) converting the metal precursor film to a superconductor film by an oxidation process. The metal precursor film is preferably applied as an organometallic mixture, which decomposes into its constituent metals in a subsequent pyrolysis step. The patterning step utilizes conventional photolithography techniques.

A unique aspect of the process is that the film is patterned while it is metallic, and is oxidized after the patterning step. This is advantageous because a great deal is known about etching metal thin films, while very little is known about etching YBaCuO superconductor thin films.

These and other objects and advantages of the present invention will become apparent to those skilled in the art after reading the following descriptions.

BEST MODE FOR CARRYING OUT THE INVENTION

The preferred embodiments of the present invention will be discussed in terms of the new YBaCuO class of high temperature superconductors that were discovered by Wu et al., supra. However, it should be apparent to those skilled in the art that the methods described herein could be practiced with a wide variety of ceramic superconducting materials, many of which are yet to be discovered.

The process of the present invention includes three basic steps, each of which can be performed in a variety of manners. The basic steps are:
1) Depositing a metal precursor film of superconductor precursor elements on a substrate;
2) Patterning the metal precursor film; and
3) Oxidizing the metal precursor film to form a superconductor film.

Step 1—Metal Film Deposition

A preferred method for applying a metal film of superconductor precursor elements on a substrate involves the use of a class of materials known as organometallic compounds. These compounds are commercially available and are typically used for thick film metal-ink applications. One type of organometallic compound is commonly referred to as resinates because, historically, they were derived from resinous acids, although they are now derived from a variety of organic materials.

The composition and solvent systems for resinates are usually maintained as trade secrets by their suppliers. However, typical materials used in the production of resinates include fatty acids such as capric acid, salts of resin acids such as abietic acid, and mercaptides. Typical solvents used for the production of resinates include toluene and xylene.

Resinates are available from a variety of sources, both as off-the-shelf items and as custom products. For example, barium resinates and copper resinates can be ordered as product numbers 137C and 29B, respectively, from Engelhard Corporation of Menlo Park, N.J. A yttrium resinate is available as a custom order from Haraeus Cermalloy of West Conshohocken, Pa.

To produce a metal film including yttrium (Y), barium (Ba), and copper (Cu), solutions of the resinates of those elements are thoroughly mixed together to make a resinate mixture. While the volume and weight proportions of the various resinates will vary depending upon the Y/Ba/Cu element content in the respective resinate solutions, the elemental proportions of Y, Ba, and Cu should be 1:2:3 if $Y_1Ba_2Cu_3O_7$ superconductor is the desired end result.

Once the resinate mixture has been prepared, it can be applied to a substrate by a number of techniques well known to those skilled in the art. For example, the resinate mixture can be sprayed, screen printed, dip coated, or spun onto a substrate to a desired thickness.

After the resinate mixture has been applied, the solvent is allowed to evaporate, leaving a dried resinate mixture on the substrate. The mixture is then pyrolyzed at approximately 300° C. to drive off the organic constituents.

If the pyrolysis of the mixture takes place in a reducing atmosphere, the resultant film will be a metal alloy including Y, Ba, and Cu in the proper proportions. If the pyrolysis takes place in an oxidizing atmosphere, the film will oxidize and form a ceramic including superconductor components. Therefore, if the desired end result is a patterned superconductor film, it is better to pyrolyze the mixture in a reducing atmosphere, because techniques for patterning metal films are much better understood than techniques for patterning ceramics. On the other hand, if the desired end result is an unpatterned film, the pyrolysis can take place in an oxidizing atmosphere to directly form an unpatterned superconductor film. Unpatterned films are useful on various planar and non-planar substrates such as fibers, tubes, spheres, and irregular shapes.

However, the major thrust of the present invention is to produce patterned superconductor films and, therefore, the pyrolysis preferably takes place in a reducing atmosphere. Films as thin as 0.25 micron have been obtained by the described methods, and much thicker films can be built up in multiple coating cycles followed by pyrolysis.

The resultant metal precursor film is generally dense and well-adhering. In some circumstances, it may be desirable to add trace amounts of modifiers to improve film forming properties and adhesion, or the film may be subjected to additional heating cycles to accomplish the same results.

A thin layer of silver may be deposited over the metal precursor film to improve its chemical resistance to subsequent patterning steps. The silver layer does not have to be removed prior to the oxidation step because silver is highly permeable to oxygen at elevated temperatures and will allow the patterned metal precursor film to oxidize beneath it.

It should be noted that the metal precursor film can be produced by many conventional methods other than the pyrolysis method described above. For example, the metal precursor film can also be produced by sputtering, plating, evaporation, and chemical vapor deposition techniques.

Step 2—Metal Precursor Film Patterning

Once the metal precursor film has been produced, by whatever method, it can be patterned using conventional photolithographic techniques well known to those skilled in the art. Many publications describe the details of standard photolithographic techniques, such as the book *Semiconductor and Integrated Circuit Fabrication Techniques*, published by the Preston Publishing Company.

Briefly, a photosensitive resist is spun onto the metal precursor film, and then the substrate is soft baked. The resist is then exposed to an energy pattern to differentiate selected portions of the resist. The energy pattern is typically produced by a photolithography machine which directs ultraviolet light through a mask and onto the resist. Alternatively, the energy pattern can be produced by an E-beam lithography machine which directs a beam of electrons to selected portions of the resist.

After exposure, the resist is hard baked and developed. If a negative resist has been used, those portions which have been exposed to the energy source will remain after the resist has been developed, while a positive resist will leave the unexposed portions.

At this point in the process, the metal precursor film is protected by resist in those areas where a superconductor film is desired in the end product. A mild acid solution can be used to remove the unprotected portions of the metal precursor film. An alternative method for removing the unprotected portions of the metal precursor film, along with some of the resist, is by sputter etching. Finally, the remaining resist can be removed with a process compatible solvent, or can be left on to be burned off in the subsequent oxidation step.

It should be noted that the ease in processing the precursor film at this stage is directly due to the fact that it is a metal alloy material rather than a superconductor ceramic material. The experience of researchers in the field, such as Beasley and Geballe of Stanford University, indicate that the processing chemicals of conventional photolithography methods destroy the superconducting properties of ceramic superconductor films.

Step 3—Oxidation of the Precursor Film

There are several suitable methods for oxidizing the patterned, metal precursor film to change it into a patterned superconductor film. For example, various plasma, chemical, and thermal techniques can be employed. The essential function of any of the oxidation processes is to insert oxygen into the metal lattice to allow superconductor phase to form in the patterned film.

If a plasma approach is used, the film is placed in an oxygen-plasma oven for several hours, the exact time being determined by the thickness and temperature of the film. If present, any remaining resist can be burned off at the same time.

To use a chemical oxidizer, the substrate is placed in a bath of liquid oxidizer where it remains immersed for several hours. If chemical oxidation is selected, care must be taken to select chemicals which do not dissolve the metal precursor film or the resultant oxides.

Thermal oxidation involves the placement of the substrate in flowing-oxygen furnace. Typically, the furnace is initially set at approximately 400° C. until oxidation is complete, where the actual time is be dependent upon the thickness of the film.

For all of the oxidation methods described above, the substrate is next placed in a furnace having an internal temperature of 900° C. for approximately two hours to convert the oxides to their superconductor phase. Finally, the substrates are cooled to approximately 400°–500° C. in an oxygen atmosphere for at least two hours to improve their superconducting properties, followed by a cooling to room temperature.

The superconducting properties of the oxide films can be enhanced if they have a single-crystal structure. As is well known to those skilled in the art, single-crystal layers can be produced by a process known as epitaxy, where deposited layers adopt the crystal lattice structure of their supporting substrate. Suitable epitaxial substrates for the present invention are strontium titanate or <1,1,1> oriented silicon.

While this invention has been explained in terms of several preferred modes, it is contemplated that those skilled in the art will realize certain modifications, additions, and permutations of the present invention upon reading the preceding descriptions. It is therefore intending that the following appending claims includes all such modifications, additions, and permutations which fall within the true spirit and scope of the present invention.

What is claimed is:

1. A method for forming a patterned ceramic superconducting film on a surface comprising the steps:
    applying a metal precursor film to a surface, said metal precursor film including, in proper stoichiometric proportions, the metallic elements of a ceramic superconducting material;
    patterning the metal precursor film to produce a patterned metal precursor film; and
    heating the patterned metal precursor film to convert the patterned metal precursor film into a patterned ceramic superconducting film on said surface.

2. A method for forming a patterned ceramic superconducting film as recited in claim 1 wherein said step of patterning said metal precursor film includes a lithographic process.

3. A method for forming a ceramic superconducting film as recited in claim 2 wherein said lithographic process includes:
    forming a resist layer over said metal precursor film;
    exposing portions of said resist layer to an energy source;
    developing said resist layer to form a patterned resist layer;
    etching said precursor film through said patterned resist layer; and
    removing said patterned resist layer.

4. A method for forming a patterned ceramic superconducting film as recited in claim 1 wherein said metal precursor film is epitaxially grown.

5. A method for forming a ceramic superconductor film on a surface comprising the steps of:
    applying a metal precursor film to a surface, said metal precursor film including the metallic elements of a ceramic superconductor material in their proper stoichiometric proportions;
    patterning said metal precursor film to produce a patterned metal precursor film; and
    oxidizing said patterned metal precursor film to convert the patterned metal precursor film into a patterned ceramic superconductor film on said surface.

6. A method for forming a ceramic superconductor film as recited in claim 5 wherein said step of patterning said metal precursor film includes a lithographic etching process.

7. A method for forming a ceramic superconductor film as recited in claim 6 wherein said lithographic etching process includes:
    forming a resist layer over said metal precursor film;
    exposing portions of said resist layer to an energy source;
    developing said resist layer to form a patterned resist layer;
    etching said precursor film through said patterned resist layer; and removing said patterned resist layer.

* * * * *